(12) United States Patent
Yu et al.

(10) Patent No.: US 8,940,563 B2
(45) Date of Patent: Jan. 27, 2015

(54) METHOD FOR MANUFACTURING OPTOELECTRONIC MODULE

(71) Applicants: Shang-Jen Yu, Zhubei (TW);
Chien-Chen Hsieh, Hsinchu (TW);
Chun Chiang Yen, Hsinchu (TW)

(72) Inventors: Shang-Jen Yu, Zhubei (TW);
Chien-Chen Hsieh, Hsinchu (TW);
Chun Chiang Yen, Hsinchu (TW)

(73) Assignee: Centera Photonics Inc., Hsinchu (TW)

( * ) Notice: Subject to any disclaimer, the term of this patent is extended or adjusted under 35 U.S.C. 154(b) by 0 days.

(21) Appl. No.: 14/082,084

(22) Filed: Nov. 15, 2013

(65) Prior Publication Data

US 2014/0068924 A1    Mar. 13, 2014

Related U.S. Application Data

(63) Continuation-in-part of application No. 13/426,623, filed on Mar. 22, 2012.

(30) Foreign Application Priority Data

| Mar. 24, 2011 | (TW) | 100110220 A |
| Sep. 9, 2011 | (TW) | 100132684 A |
| Oct. 28, 2011 | (TW) | 100139464 A |

(51) Int. Cl.
*H01L 21/00* (2006.01)
*H05K 13/04* (2006.01)
*G02B 6/42* (2006.01)

(52) U.S. Cl.
CPC .............. *H05K 13/04* (2013.01); *G02B 6/4201* (2013.01)
USPC ................ 438/29; 257/98; 257/80; 257/84

(58) Field of Classification Search
CPC ....... H01L 27/14; H01L 33/60; H01L 25/167; H01L 27/14643; H01L 27/14625; H01L 27/14629; H01L 31/167
USPC ........... 257/79, 80, 81, 82, 84, 91, 95, 98, 99, 257/100, 431, 432, 433, 778, 782, 783, 774, 257/678; 438/22, 24, 25, 26, 27, 29, 64, 65, 438/69, 106, 108, 121
See application file for complete search history.

(56) References Cited

U.S. PATENT DOCUMENTS

| 4,897,711 A | 1/1990 | Blonder et al. |
| 5,698,866 A * | 12/1997 | Doiron et al. ................ 257/99 |

(Continued)

FOREIGN PATENT DOCUMENTS

| CN | 101017228 | 8/2007 |
| CN | 100397122 | 6/2008 |

(Continued)

OTHER PUBLICATIONS

"Office Action of China Counterpart Application", issued on Jan. 14, 2014, p. 1-p. 13.

(Continued)

*Primary Examiner* — Tranh Y Tran
(74) *Attorney, Agent, or Firm* — Jianq Chyun IP Office

(57) ABSTRACT

A method for manufacturing an optoelectronic module is proposed. The method comprises the following steps: providing a top cover with a reflective surface. Then, a light-guiding structure is formed. A mounting device is provided. Next, an optoelectronic device is formed on the mounting device with a first precision. A control chip is formed on the mounting device with a second precision different from the first precision. The top cover combines with the mounting device, wherein the light-guiding structure is between the top cover and the mounting device, and the optoelectronic device faces the reflective surface.

19 Claims, 11 Drawing Sheets

(56) References Cited

U.S. PATENT DOCUMENTS

| | | |
|---|---|---|
| 6,132,107 A | 10/2000 | Morikawa |
| 7,058,266 B2 | 6/2006 | Arakida et al. |
| 2007/0221943 A1* | 9/2007 | Moriya et al. ............... 257/99 |
| 2010/0060578 A1* | 3/2010 | Chen et al. ............... 345/161 |
| 2012/0241600 A1* | 9/2012 | Lee et al. ............... 250/227.11 |

FOREIGN PATENT DOCUMENTS

| | | |
|---|---|---|
| CN | 101354462 | 1/2009 |
| CN | 101375383 | 2/2009 |
| CN | 101521194 | 9/2009 |
| CN | 101771012 | 7/2010 |
| CN | 101876732 | 11/2010 |
| CN | 1781043 | 5/2011 |
| JP | 2002-006161 | 1/2002 |
| JP | 2003-167175 | 6/2003 |
| JP | 2007-121973 | 5/2007 |
| JP | 2007-334166 | 12/2007 |
| JP | 2008-065293 | 3/2008 |
| TW | 200942885 | 10/2009 |

OTHER PUBLICATIONS

"Office Action of China Counterpart Application", issued on Aug. 16, 2013, p. 1-p. 14.

"Office Action of China Counterpart Application", issued on Dec. 31, 2013, p. 1-p. 13.

"Office Action of Taiwan Counterpart Application", issued on Nov. 7, 2013, p. 1-p. 16.

"Office Action of Taiwan Counterpart Application", issued on Dec. 5, 2013, p. 1-p. 9.

* cited by examiner

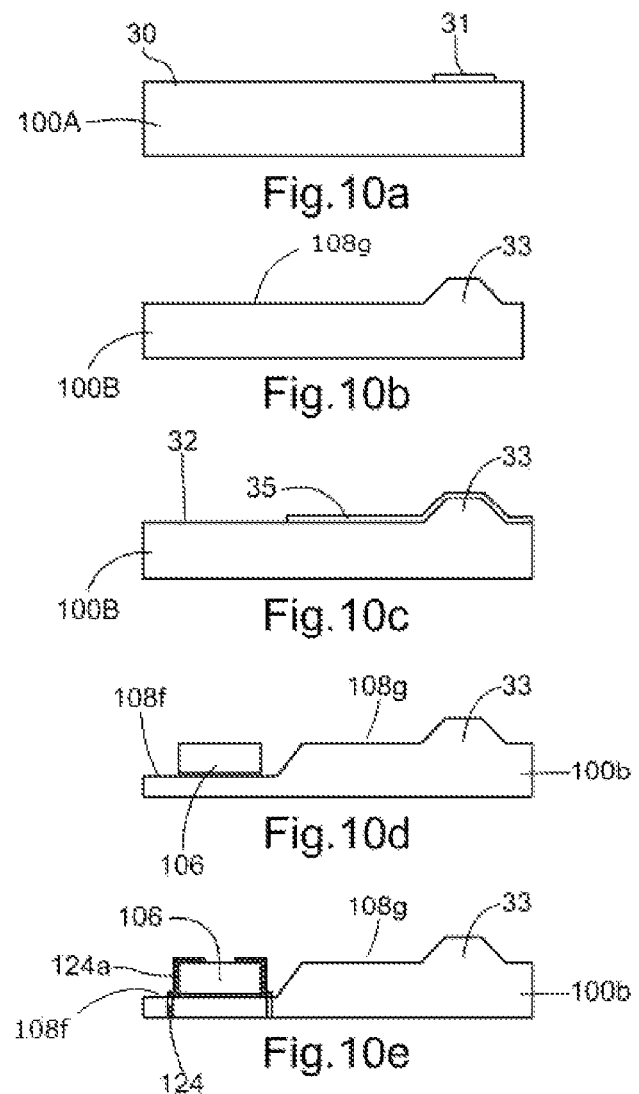

US 8,940,563 B2

METHOD FOR MANUFACTURING OPTOELECTRONIC MODULE

CROSS-REFERENCE TO RELATED APPLICATION

The present application is a Continuation in Part of U.S. application Ser. No. 13/426,623 filed Mar. 22, 2012 for "OPTOELECTRONIC MODULE", which claims priority to the following foreign patent applications: TAIWAN Patent Application Serial Number 100110220 of Mar. 24, 2011, TAIWAN Patent Application Serial Number 100132684 of Sep. 9, 2011, and TAIWAN Patent Application Serial Number 100139464 of Oct. 28, 2011, which are herein incorporated by reference.

TECHNICAL FIELD

Embodiments of the present invention generally relates to an optoelectronic module, more particularly, to a method for manufacturing an optoelectronic module.

BACKGROUND

Electronic devices may be equipped with a connector for electrical connection with other devices to communicate or transmit signals with other devices. However, as technology advances, electronic device's design has the trend towards light and thin. It is difficult to install the plastic body of a connector manufactured by the traditional molding method or the conductive terminals manufactured by utilizing a stamping technology in the light-thin electronic devices.

Currently, the optical coupling element as a photoelectric conversion and signal transmission has been widely used in the various circuits, the electronic device or system related. Related components are designed with smaller size for matching the optical coupling element. It will have considerable difficulty and inconvenience that the fiber is assembled or installed into the optical coupling element to conduct optical signals in or out of the optical coupling element for transmission. It even induces error, and thereby affecting transmission due to the optical signals without accurately transmitting to the fiber. Moreover, the optical fiber needs to be assembled or installed to fix within the optical coupling element such that it can not provide insertion/removal and assembly repeatedly. It is inconvenient to be used to the linear extension of the exposing outside back end of the fiber.

One kind of a silicon optical bench is used for an application base of the optical interconnection of board to board or USB 3.0 optical links. Based-on the base, the structure of an optical interconnection transceiver integrated on the silicon optical bench may include a micro-reflective surface, V-groove structure for fiber array, 2.5 GHz (or above 2.5 GHz) high frequency transmission lines and solder bumps. By an appropriate optical alignment, a surface-emitting laser and a photo detector can be packaged onto the silicon optical bench.

Moreover, currently, a chip and a laser device are well developed to integrate onto a silicon optical bench. However, in the manufacturing process of optical interconnection transceiver, in order to achieve high optical coupling efficiency, laser device, chip, and other associated components are formed or placed with high precision on a silicon optical bench. As the result, as long as one component is not high-precisely positioned, the optical interconnection transceiver would be a defective product. Thus, it increases manufacturing costs because the yield rate of the products decreases due to the problem in alignment accuracy.

SUMMARY

An embodiment of the present invention provides an optoelectronic module including a mounting device, an optoelectronic device, a light-guiding structure, a top cover, and a control chip. The mounting device has a concave structure and one of a concave portion and a convex portion formed thereon. The optoelectronic device is disposed on the bottom surface of the concave structure, wherein the optoelectronic device is capable of emitting or receiving an optical signal. The light-guiding structure is formed on the top cover. The top cover has a reflective surface and the other of the concave portion and the convex portion. The top cover is combined with the mounting device by aligning the concave portion and the convex portion. The light-guiding structure is placed between the top cover and the mounting device, and the optoelectronic device faces the reflective surface. The reflective surface is for transmitting the optical signal between the optoelectronic device and the light-guiding structure. The control unit is disposed on the mounting device for controlling the optoelectronic device.

An method of the present invention for manufacturing the optoelectronic module comprises the following steps: providing the top cover with the reflective surface; forming the light-guiding structure; providing the mounting device; forming the optoelectronic device on the mounting device with a first precision; forming the control chip on the mounting device with a second precision different from the first precision; and combining the top cover and the mounting device. The optoelectronic device is aligned to the mounting device via an alignment mark. The concave portion and the convex portion are used to align the top cover and the mounting device with the first precision. The first precision is higher than the second precision.

According to another embodiment of the present invention, the optoelectronic device is mounted on the bottom surface of the concave structure with the first precision, and the control chip is mounted on the bottom surface of the concave structure with the second precision.

According to another embodiment of the present invention, the mounting device comprises a substrate and a sub-mount, the concave structure is formed on the substrate, the control chip is mounted on the sub-mount with the second precision, the optoelectronic device is mounted on the bottom surface of the concave structure of the substrate with the first precision, and the substrate is mounted on the sub-mount with the second precision.

To improve the shortcoming for the prior art having a low yield rate, the present invention utilizes at least two alignment steps with respective precisions which are different to each other for improving the manufacturing yield rate of the optoelectronic module. In the manufacturing process of the optoelectronic module for one embodiment of the present invention, the optoelectronic device is mounted on the mounting device with high precision, and the control chip is mounted there with low precision to increase the manufacturing yield rate. The manufacturing process of the optoelectronic module for another embodiment of the present invention further utilize an alignment mark to mount the optoelectronic device on the mounting device with high precision. The reflective surface and light-guiding structure are positioned with high precision by concave portion and convex portion. The invention has the advantages of easy manufacture and a high yield rate and can achieve the requirement of high optical coupling efficiency.

BRIEF DESCRIPTION OF THE DRAWINGS

The components, characteristics and advantages of the present invention may be understood by the detailed descriptions of the preferred embodiments outlined in the specification and the drawings attached:

FIGS. 10a-10d illustrate a process flow for forming a substrate 100b according to one embodiment of the present invention;

FIG. 10e illustrates another substrate 100b according to one embodiment of the present invention;

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

References in the specification to "one embodiment" or "an embodiment" refers to a particular feature, structure, or characteristic described in connection with the preferred embodiments is included in at least one embodiment of the present invention. Therefore, the various appearances of "in one embodiment" or "in an embodiment" do not necessarily refer to the same embodiment. Moreover, the particular feature, structure or characteristic of the invention may be appropriately combined in one or more preferred embodiments.

Figure 1:
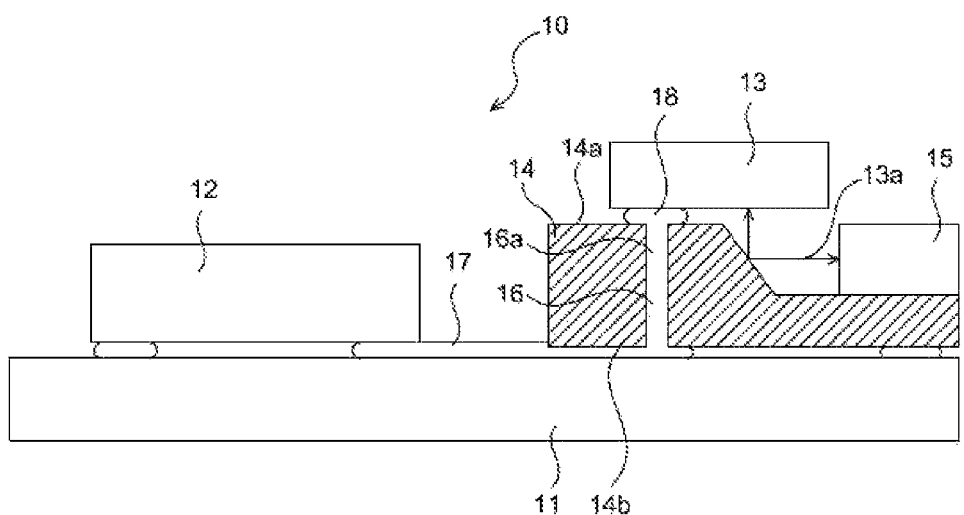
FIG. 1 illustrates an optoelectronic module according to one embodiment of the present invention.

FIG. 1 shows an optoelectronic module of an embodiment of the present invention. In this embodiment, the optoelectronic module 10 may be as a passive optical interconnection transmitter or receiver. For example, the optoelectronic module 10 includes a semiconductor substrate 14, a control chip 12, an optoelectronic device 13 and a light-guiding structure 15. In other words, the present invention may utilize the light-guiding structure 15 for unidirectional or bidirectional transmission. The substrate 14 has a top surface 14a, a bottom surface 14b, a through hole structure 16 and a conductive material 16a, wherein the top surface 14a is opposite to the bottom surface 14b, the through hole structure 16 passes through from the top surface 14a to the bottom surface 14b of the substrate 14, and the conductive material 16a is filled into the through hole structure 16. The semiconductor substrate 14 and the control chip 12 are configured on the print circuit board (PCB) 11, and the optoelectronic device 13 is configured on the semiconductor substrate 14. The control chip 12 is for example a driver integrated circuit (IC) or a transimpedance amplifier (TIA) chip, wherein the driver IC may be used to drive the optoelectronic device 13 for emitting light. For example, the semiconductor substrate 14, such as silicon sub-mount, is used to be as a silicon optical bench, and has a concave bench for facilitating the light-guiding structure 15 to be disposed thereon, and a reflective surface having a specified angle (such as 45 degree angle). The reflective surface may be an optical surface required for various optoelectronic devices. A transmission line (trace) 18 is formed on the top surface 14a of the semiconductor substrate 14 for electrically connecting to the optoelectronic device 13. The optoelectronic device 13 may be a light emitting or receiving element, for example a laser, a photo detector or a light emitting diode (LED). The laser is a vertical-cavity surface-emitting laser (VCSEL), for example.

The transmission line 18 of the embodiment of the present invention is coupled to the PCB 11 via the conductive material 16a filled into the through hole structure 16 and a transmission line (trace) 17 formed on the bottom surface 14b of the substrate 14, and coupled to the control chip 12 via circuits on the PCB 11. In other words, the control chip 12 is coupled to the PCB 11 via the transmission line 17, and the optoelectronic device 13 is coupled to the PCB 11 via the transmission line 18, the conductive material 16a filled into the through hole structure 16 and the transmission line 17. Therefore, the control chip 12 is coupled to the optoelectronic device 13 via the transmission line 18, the conductive material 16a filled into the through hole structure 16 and the transmission line 17. The transmission line 18 and 17, such as 10 GHz or more high frequency transmission line, are formed on the top surface 14a and the bottom surface 14b of the semiconductor substrate 14, respectively for electrically connecting to the control chip 12 and the optoelectronic device 13.

As above mentioned, the control chip 12 and the optoelectronic device 13 can be electrically communicated with each other by the transmission line, and then transmit/receive optical signals to/from the external device via the light-guiding structure 15. In other words, optical signals can be formed a bidirectional transmission between the external device and the optoelectronic device 13. For example, the light-guiding structure 15 is as an interface of optical output and input which may be adapted by a fiber, a waveguide or a jumper to transmit signals.

In one embodiment, the semiconductor substrate 14 has a concave structure formed a specified depth beneath thereof. The first end of the concave structure forms a reflective surface, and a plurality of grooves are formed on the concave structure. Based-on the grooves of the concave structure, the light-guiding structure 15 may be passively aligned to the grooves.

For example, the optoelectronic device 13 is configured adjacent to the first end of the concave structure and coupled to the light-guiding structure 15 through the reflective surface. Therefore, the optical path 13a of the optoelectronic device 13 includes the optical signal emitted by the optoelectronic device 13 is reflected by the reflective surface to enter into the light-guiding structure 15, or the optical signal passing through the light-guiding structure 15 is reflected by the reflective surface to enter into the optoelectronic device 13.

Figure 2:
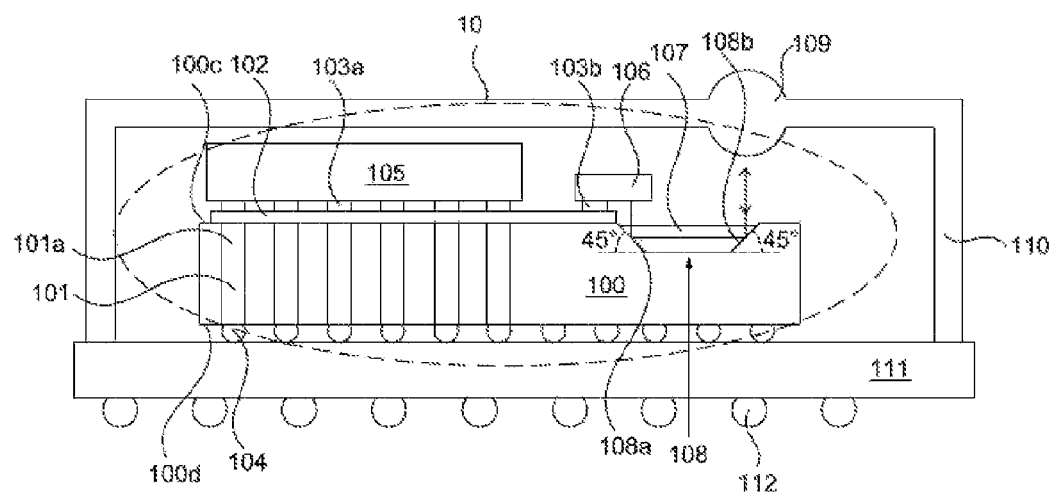
FIG. 2 illustrates an optoelectronic module according to another embodiment of the present invention.

FIG. 2 shows an optoelectronic module of an embodiment of the present invention. In this embodiment, the optoelectronic module 10 may be as a passive optical interconnection transmitter or receiver. For example, the optoelectronic module 10 includes a semiconductor substrate 100, a fan-out conductive pattern 102, top solder bumps 103a/103b, bottom solder bumps 104, a control chip 105, an optoelectronic device 106 and a light-guiding structure 107. The substrate 100 has a top surface 100c, a bottom surface 100d, a concave structure 108, a first through hole structure 101 and a first conductive material 101a, wherein the top surface 100c is opposite to the bottom surface 100d, and the concave structure 108 is formed on the top surface 100c and has a first reflective surface 108a and a second reflective surface 108b opposite to each other. The first through hole structure 101 passes through from the top surface 100c to the bottom surface 100d of the substrate 100. The first conductive material 101a is filled into the first through hole structure 101 to form a TSV (through silicon via). The TSV is electrically connected to the fan-out conductive pattern 102. The fan-out conductive pattern 102 is formed on the top surface 100c of the substrate 100. The top solder bumps 103a/103b are directly electrically connected to the control chip 105, the optoelectronic device 106 and the fan-out conductive pattern 102 respectively, or electrically connected to the control chip 105 and the optoelectronic device 106 via the fan-out conductive pattern 102. In other words, the control chip 105 is electrically connected to the optoelectronic device 106 via the fan-out conductive pattern 102, and the control chip 105 is electrically connected to the laminate board 111 through the top solder bumps 103a and via the fan-out conductive pattern 102 and the conductive material 101a. In such embodiment, the top solder bumps 103a is electrically connected to the fan-out conductive pattern 102.

Pins of the bottom surface of the control chip 105, for example solder bumps, may be fan out to outside of the coverage area of the control chip 105 by utilizing the fan-out conductive pattern 102 for providing a better connection to other devices and to reduce the electromagnetic interference between the pins.

For example, the substrate 100 is a silicon interposer 100. The light-guiding structure 107 is an optical waveguide structure disposed in the concave structure 108 and located between the first reflective surface 108a and the second reflective surface 108b. The concave structure 108 formed on the substrate 100 may be used as a silicon optical bench 108. The first reflective surface 108a and the second reflective surface 108b are respectively located at opposite sides of the concave structure 108. Each of the first reflective surface 108a and the second reflective surface 108b has a 45 degree included angle as optical micro-reflective surface required for various optoelectronic devices. The optoelectronic device 106 may be configured adjacent one side of the concave structure 108, for example the first reflective surface 108a. For example, the optoelectronic device 106 is configured on the substrate 100, wherein the optoelectronic device 106 may be capable of emitting or receiving optical signals. The first reflective surface 108a and the second reflective surface 108b are located on the optical paths of the optical signals. For example, the light-guiding structure 107 includes the polymer material with refractive index about 1.4 to 1.6, which may be manufactured by a thin film deposition process to achieve the effect of waveguide. Depending on the practical application, the light-guiding structure 107 can be chosen to fill or not fill into the concave structure 108.

In one embodiment, the substrate 100 may be used as a sub-mount of a driver IC/a trans-impedance amplifier or a vertical-cavity surface-emitting laser (VCSEL)/a photo detector (PD). Moreover, the substrate 100 may be also integrated with other logic device, a memory or integrated passive devices (IPD) formed thereon. In another embodiment, the substrate 100 may be integrated with a processing chip, a central processing unit, a video chip, a sound chip or a data chip formed thereon.

The optoelectronic module 10 further includes a laminate board or plate 111 configured under the substrate 100, and the bottom solder bumps 104 are coupled to the laminate board 111 and the conductive material 101a. In another embodiment, a second fan-out conductive pattern (not shown) may be optionally configured under the bottom surface 100d of the substrate 100 and connected to the bottom solder bumps 104. Pins of the bottom surface 100d of the substrate 100 may be fan out by utilizing the second fan-out conductive pattern for providing a better connection to other devices and to reduce the electromagnetic interference between the pins. The laminate board 111 is for example a PCB, with solder bumps 112 formed under the laminate board 111 for coupling to the external device. Besides, the optoelectronic module 10 further includes a housing 110 with a light modulating component 109. The position of the light modulating component 109 corresponds to that of the second reflective surface 108b and the light modulating component 109 is located on the optical paths of the optical signals. The light modulating component 109 is for example a lens. In an example, the whole substrate 100 is sealed on the laminate board 111 by utilizing the housing 110. The control chip 105 is a control unit configured on the top surface 100c of the substrate 100 and electrically connects to the TSV and the optoelectronic device 106 for controlling the optoelectronic device 106.

In one embodiment, the substrate 100 is used as a silicon interposer material. As the substrate 100 is coupled to the lower laminate board 111, it needs to meet the requirement of trace accuracy for the laminate board 111. As the laminate board 111 is a PCB, it needs to meet the requirement of process accuracy of the PCB 111 for the bottom solder bumps 104 under the substrate 100. In other words, in order to make the control chip 105 couple to the lower printed circuit board 111, the bottom solder bumps 104 is electrically fan out via the second fan-out conductive pattern, and the spacing setting of the bottom solder bumps 104 depends on the accuracy demand of the PCB 111. As the laminate board 111 is an alumina substrate or a ceramic base, the spacing of the bottom solder bumps 104 under the substrate 100 may be smaller.

The depth of the TSV depends on the through-hole type (pre-formed through-hole or post-formed through-hole) and its application. The depth of the TSV is 20~500 micron, preferably about 50~250 micron. The through-hole opening of the TSV has a via size, for example a diameter 20~200 micron, preferably about 25~75 micron. The aspect ratio of the TSV is 0.3:1 to larger than 20:1, for example about 4:1 to 15:1.

In one embodiment, the through-hole of the TSV, i.e. the first through-hole structure 101, includes an opening at the top surface 100c of the substrate 100, a sidewall extending from the top surface 100c of the substrate 100 and a bottom part. The method for forming the TSV includes a process of the substrate 100 immersing in electrolytic metal (for example copper) deposition compositions. The electrolytic metal deposition compositions include a metal (for example copper) ion source, acid (inorganic acid, organic acid, and/or mixture), one or more organic compounds (facilitating the speed of copper deposition at the bottom of the through-hole faster than that at the opening of the through-hole) and chloride ion. Next, the current is supplied to the electrolytic copper deposition compositions such that cooper is deposited on the bottom and the sidewalls for filling from the bottom to the top, and thereby forming the TSV with copper filler. In the embodiment, the first conductive material 101a includes copper.

The control chip 105 is for example a driver IC or a transimpedance amplifier (TIA) chip, wherein the driver IC can be used for driving the optoelectronic device 106 for light emitting. The control chip 105 and the optoelectronic device 106 are coupled to the top solder bumps 103a/103b via the fan-out conductive pattern 102 for electrical communication with each other. The control chip 105 is electrically communication with the laminate board 111 via the top solder bumps 103a, the fan-out conductive pattern 102, the first through hole structure 101 and the bottom solder bumps 104 under the control chip 105. The conductive material 101a is electrically connected to the fan-out conductive pattern 102 and the bottom solder bumps 104. The optoelectronic device 106 may be a light emitting or receiving element, for example a VCSEL, a photo detector or a LED. For the light emitting element, the optoelectronic device 106 is utilized to create or emit the corresponding converted light beam or optical signals for transmission, according to the electrical signals transmitted by the control chip 105. Laser beam emitted by the optoelectronic device 106 is reflected by the first reflective surface 108a, and then through the light-guiding structure 107 for transmission inside, followed by through the second reflective surface 108b to guide the laser beam perpendicular out of the substrate 100. For example, the optical path of the emitting light of the optoelectronic device 106 includes light emitting out of the optoelectronic device 106→the light-guiding structure 107→the reflective surface 108a having the 45 degree angle→the light-guiding structure 107 transmission inside→the reflective surface 108b having the 45 degree angle→the light-guiding structure 107→light exit out of the light-guiding structure 107→passing through the light modulating component 109 for coupling to the external optoelectronic device. The optical path of the receiving light of the optoelectronic device 106 is opposite the above optical path of the emitting light, wherein the optoelectronic device 106 is as a receiving terminal.

In one embodiment, the laser beam exit out of the light-guiding structure 107 may be modulated by the light modulating component 109 for coupling to an external fiber or other light-guiding structure. In one embodiment, the tolerance of structural error of the light modulating component 109 is ±10 micron, and the tolerance of alignment error of the light modulating component 109 is ±20 micron. The light modulating component 109 may be an optical lens or a collimation lens. The optical lens is for example a plastic optical lens.

Figure 3:
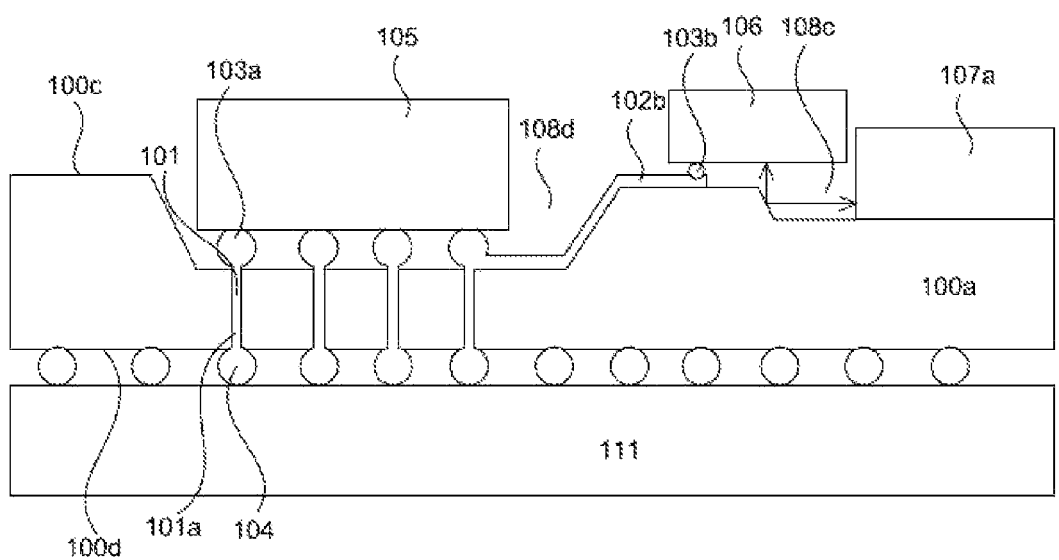
FIG. 3 illustrates an optoelectronic module according to yet another embodiment of the present invention.

FIG. 3 shows an optoelectronic module of another embodiment of the present invention. In this embodiment, the substrate 100a includes two concave structures (a first concave structure 108d, a second concave structure 108c) formed on the substrate 100a. The light-guiding structure 107a is configured inside the second concave structure 108c, and the light-guiding structure 107a is for example a fiber. The optoelectronic device 106 may be configured adjacent to the side of the second concave structure 108c, and the control chip 105 is configured inside the first concave structure 108d. Besides, the side of the second concave structure 108c adjacent to the optoelectronic device 106 may be designed as a reflective surface having a 45 degree angle. In this embodiment, the depth of the TSV may be reduced by forming the first concave structure 108d, and therefore the TSV is easy to make. The first concave structure 108d may be formed by optionally selecting a wet etching process, a dry etching process or a wet/dry etching. Moreover, the high frequency trace 102b is formed on the bottom surface of the first concave structure 108d and the side of the first concave structure 108d and partial top surface 100c of the substrate 100a, and electrically connected to the control chip 105 and the optoelectronic device 106 via the top solder bumps 103 and 103b. In this embodiment, ball grid array (BGA) type package structure may be utilized to connect a PCB 111 without wire-bonding.

Figure 4:
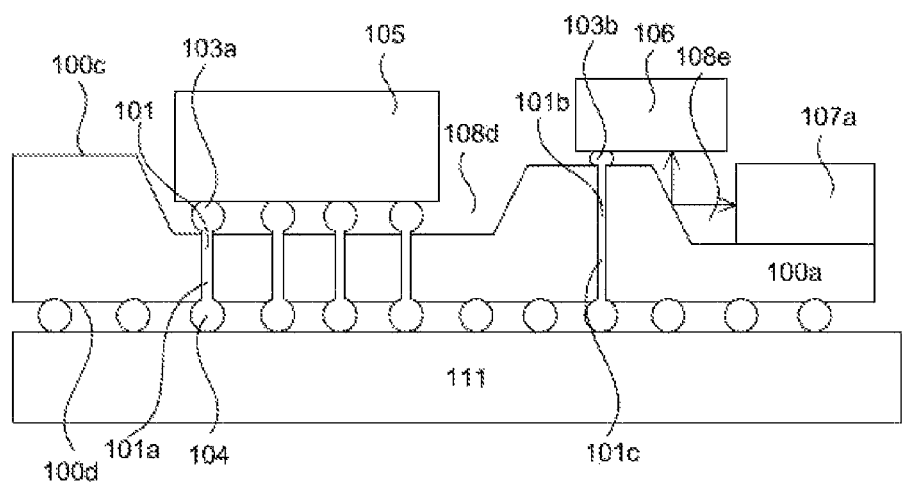
FIG. 4 illustrates an optoelectronic module according to one embodiment of the present invention.

FIG. 4 shows an optoelectronic module of an embodiment of the present invention. In this embodiment, the depth of the second concave structure 108e is different from that of the second concave structure 108c of the FIG. 3. For example, the second concave structure 108e and the first concave structure 108d is formed by utilizing an identical etching process, and therefore the depth of the two structures is substantially the same, which may be larger than the depth of the second concave structure 108c of the FIG. 3.

In this embodiment, the substrate 100a has the first through-hole structure 101 formed therein, from the bottom surface of the first concave structure 108d extending to the lower surface 100d of the substrate 100a which is filled by a first conductive material 101a to form the first TSV. The substrate 100a has the second through-hole structure 101b formed therein, from the top surface 100c of the substrate 100a extending to the lower surface 100d of the substrate 100a. A second conductive material 101c is filled into the second through-hole structure 101b to form the second TSV for coupling to the optoelectronic device 106.

The second through-hole structure 101b passes through the substrate 100a under the optoelectronic device 106 for coupling to the optoelectronic device 106 and the PCB 111 via solder bumps 103b and 104. Therefore, in this embodiment, the second through-hole structure 101b may be directly made under the optoelectronic device 106, and the control chip 105 and the optoelectronic device 106 may be integrated together via the first through-hole structure 101 and the second through-hole structure 101b without above high frequency trace 102b. The optoelectronic device 106 may be coupled to the control chip 105 via the first through-hole structure 101, the PCB 111 and the second through-hole structure 101b.

Figure 5:
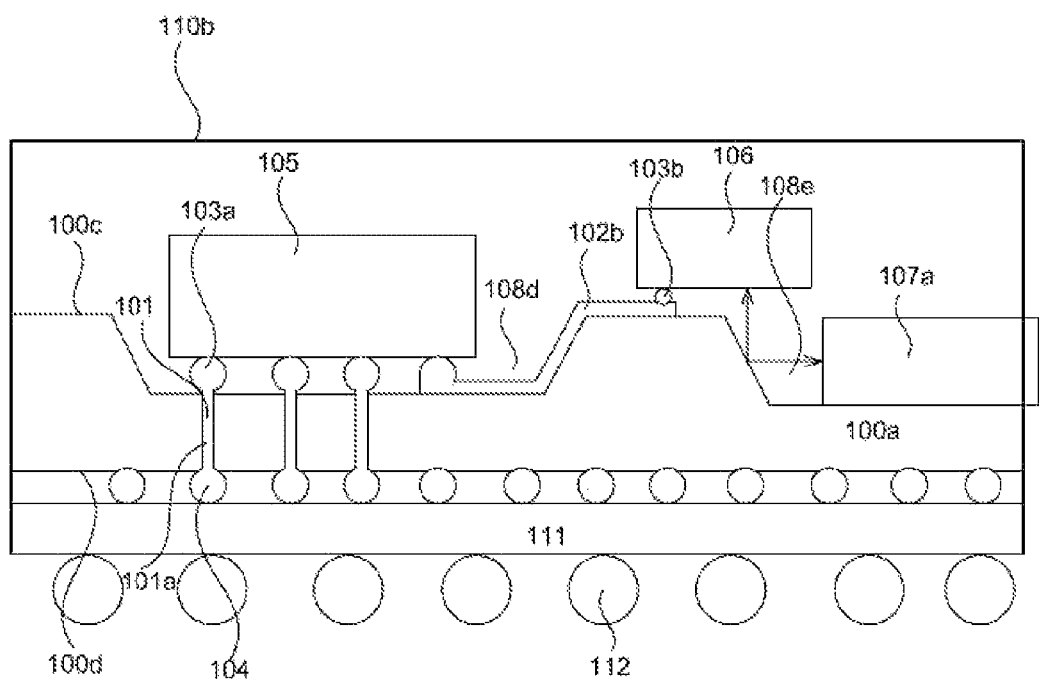
FIG. 5 illustrates an optoelectronic module according to another embodiment of the present invention.
Figure 6:
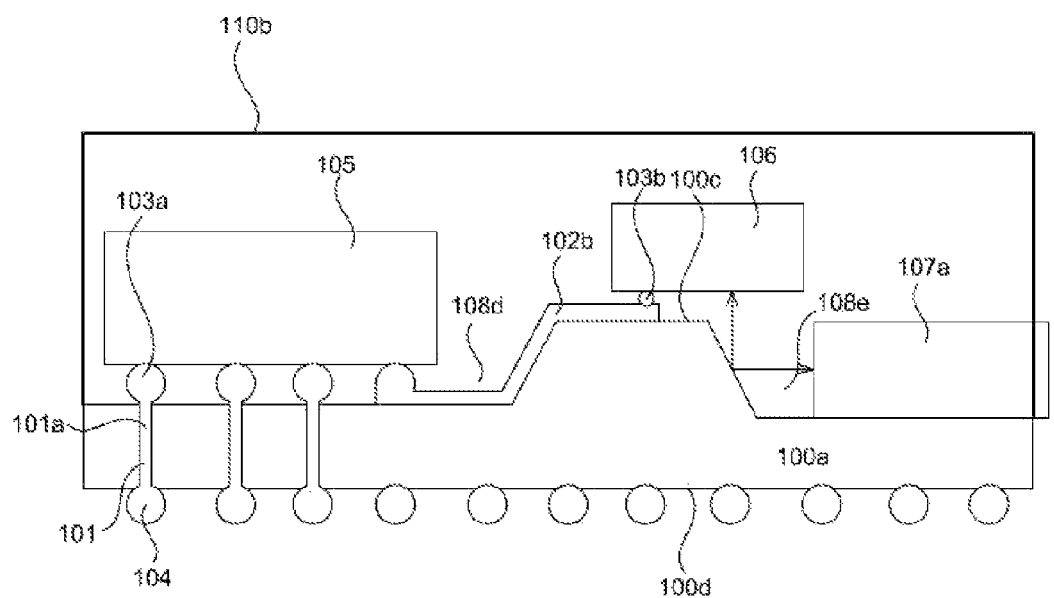
FIG. 6 illustrates an optoelectronic module according to yet another embodiment of the present invention.

FIG. 5 shows an optoelectronic module of an embodiment of the present invention. In this embodiment, for OE IC type or BGA type package structure, it can be connected to the ceramic substrate structure 111. Moreover, a case 110b covers to protect the whole optoelectronic module from external environmental contamination. For example, solder bumps 112 exposes outside the case 110b for facilitating coupling to the external device. In another example, the case 110b only covers the optoelectronic device 106, the control chip 105 and the light-guiding structure 107a above the substrate 100a, shown in the FIG. 6.

Figure 7:
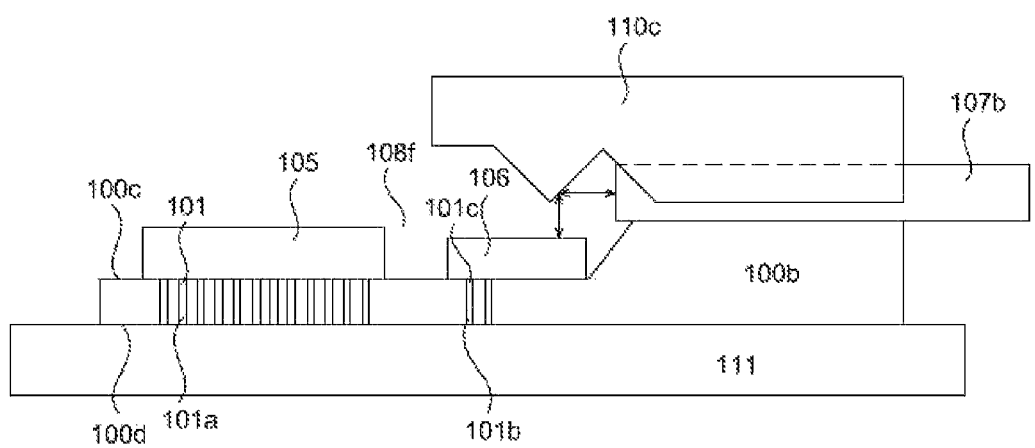
FIG. 7 illustrates an optoelectronic module according to further embodiment of the present invention.

FIG. 7 shows an optoelectronic module of yet another embodiment of the present invention. In this embodiment, the substrate 100b has a concave structure 108f, and the optoelectronic device 106 and the control chip 105 are configured and integrated on the concave structure 108f of the substrate 100b. The substrate 100b may be used as a sub-mount of chip. The optoelectronic device 106 and the control chip 105 are coupled to the PCB 111 via the first conductive material 101a and the second conductive material 101c respectively. The light-guiding structure 107a is configured on the substrate 100b. The substrate 100b is located on the PCB 111. For example, the active region and contact pads of the optoelectronic device 106 are located at the same side. In this embodiment, the optoelectronic module further includes a upper structure 110c configured over the light-guiding structure 107b as a top cover, which may combines with the substrate 100b to fix the light-guiding structure 107b. The upper structure 110c has a reflective surface having a 45 degree angle for facilitating light emitting of the optoelectronic device 106 in the vertical direction to propagate horizontally forward to the light-guiding structure 107b and then transmit to the outside by reflection of the reflective surface having the 45 degree angle. In this embodiment, the optoelectronic device 106 is coupled to the control chip 105 via the first conductive material 101a, the PCB 111 and the second conductive material 101c.

The substrate 100b has the first through-hole structure 101 formed therein, from the bottom surface of the concave structure 108f extending to the lower surface 100d of the substrate 100b. The first conductive material 101a is filled into the first through-hole structure 101 to form TSV for coupling to the control chip 105. The substrate 100b has the second through-hole structure 101b formed therein, from the bottom surface of the concave structure 108f extending to the lower surface 100d of the substrate 100b. The second conductive material 101c is filled into the second through-hole structure 101b to form TSV for coupling to the optoelectronic device 106.

Figure 8:
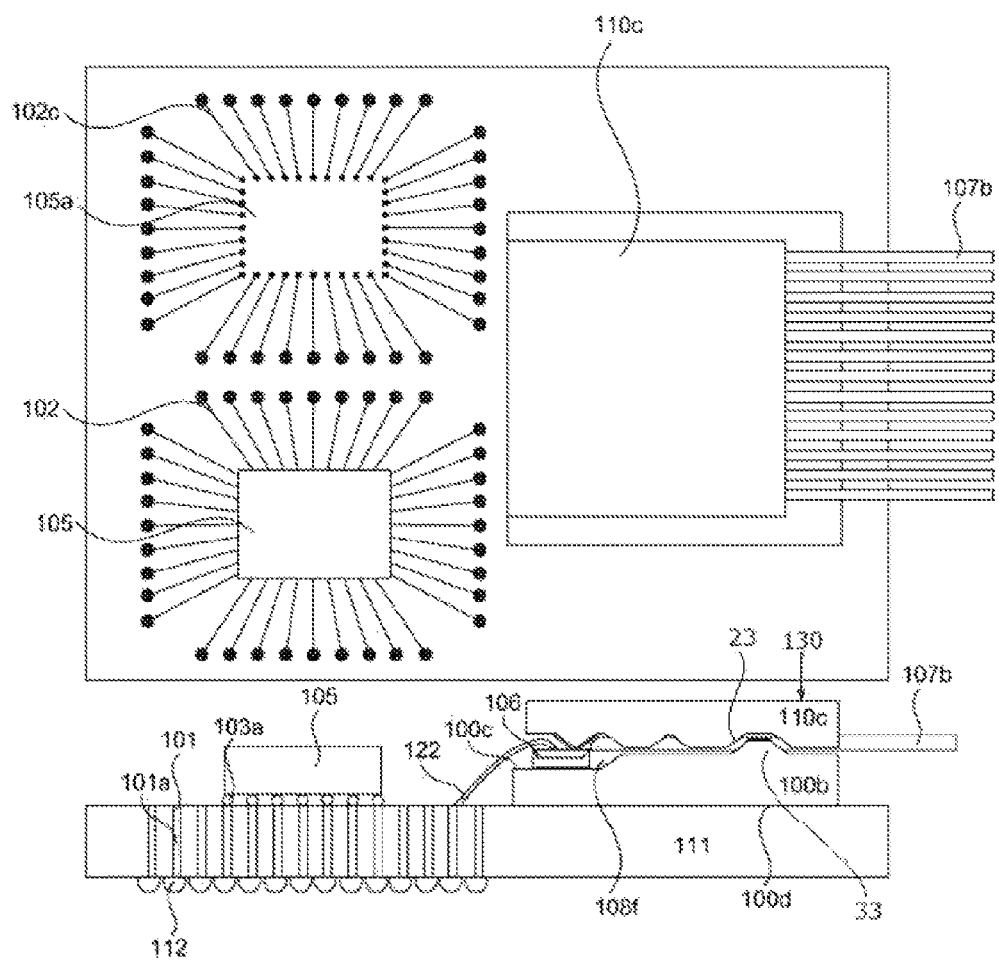
FIG. 8 illustrates an optoelectronic module according to yet another embodiment of the present invention.

Moreover, as shown in FIG. 8, in another embodiment, only the optoelectronic device 106 is configured on the concave structure 108f of the substrate 100b, and the control chip 105 is configured on another substrate, for example a ceramic sub-mount 111. The top solder bumps 103a is located on the ceramic sub-mount 111, and the conductive material 101a is filled into the first through hole structure 101 of the substrate 100b to form a TSV. The first through hole structure 101 is formed in the ceramic sub-mount 111 for electrically connecting the top solder bumps 103a and solder bumps 112. The control chip 105 is coupled to the conductive material 101a via the top solder bumps 103a and coupled to the solder bump 112 under the ceramic sub-mount 111 via the conductive material 101a. A wire-bonding 122 is electrically connected to the optoelectronic device 106 and the conductive material 101a. Based-on the ceramic sub-mount structure, in this embodiment, it may be integrated to BGA type or LGA (Land Grid Array) type OE IC chip. In this embodiment, it further includes another control chip 105a coupled to other device via a fan-out conductive pattern 102c. The control chip 105a may be coupled to traces of the ceramic sub-mount 111 via the conductive material 101a. The optoelectronic device 106 is coupled to the control chip 105 and/or the control chip 105a via the conductive material 101a, solder bumps 103a above the ceramic sub-mount 111 and a wire bonding 122.

The optoelectronic module may be connected to a fiber connector for transmitting optical signals to the external device.

As mentioned above, the embodiments of the present invention provide a newly optoelectronic module which integrates an optical waveguide structure and a through silicon via (TSV) such that the control IC and VCSEL/PD may be integrated into a single substrate.

The TSV, the light-guiding structure (such as waveguide) and the reflective surface having the 45 degree angle are integrated to a substrate such that the electrical signals may be sent to a specified IC via the TSV, and further driving active device VCSEL for emitting light. The optical signals enter into the light-guiding structure, and then twice reflecting via the reflective surface having the 45 degree angle to turn the light beam forward to up emitting. The light-guiding structure can re-guide the light beam with high efficiency. Moreover, such design of forward emitting light may be facilitating adjusting the light beam by the follow-up optical lens.

Due to the TSV, IC and VCSEL/PD may be directly integrated into the optoelectronic module package without wire bonding, and therefore the embodiments of the present invention obtain a promotion in high frequency, high speed transmission and device assembly speed. Material of the light-guiding structure may be selected from polymer material with refractive index about 1.4 to 1.6, or made by a thin film depositing process to reach the waveguide effect.

The proposed method of manufacturing the optoelectronic module is described further below.

Figure 9A:
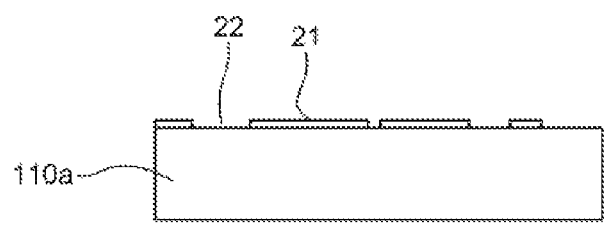
FIGS. 9a-9c illustrate a process flow for forming a top cover according to one embodiment of the present invention.
Figure 9B:
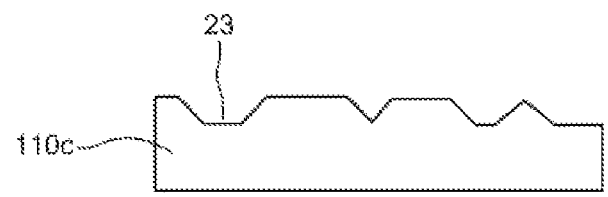
Figure 9C:
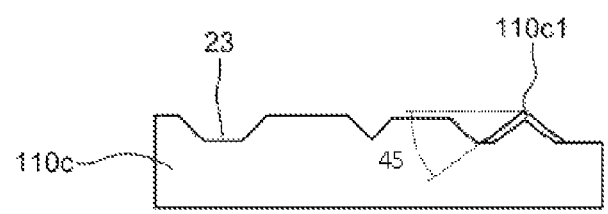

FIGS. 9a-9c illustrate a process flow for forming the top cover 110c according to one embodiment of the present invention. First, provide a substrate 110a. For example, the substrate 110a is a silicon wafer. Then, a photo-resist pattern 21 is formed on the substrate 110a by employing a photolithography process. An etching area 22 is created on the substrate 110a, shown in FIG. 9a. Next, an etching process is performed on the substrate 110a in order to form an upper structure 110c as the top cover, and the photo-resist is then stripped, shown in FIG. 9b. The material of the top cover comprises silicon, for example. Please refer to FIG. 9c, subsequently a metal layer 110c1 can be coated to form the reflective surface. By the above process, the top cover 110c includes the reflective surface 110c1, a concave portion 23, and V-groove structure, shown in FIG. 9c. The included angle between the reflective surface 110c1 and a top surface of the top cover is 45 degree. Next, the light-guiding structure 107b, for example, fibers, is assembled in the V-groove structure by optical glue, referring to FIG. 7. In another embodiment, the light-guiding structure 107b can be waveguides. The waveguides are formed directly on the top surface of the top cover, and, in this case, the V-groove structure is not needed. The optical glue or waveguides could be contact with the reflective surface 110c1 of the top cover 110c in order to increase the optical coupling efficiency.

FIGS. 10a-10d illustrate a process flow for forming the substrate 100b, as shown in FIGS. 7 and 8, according to one embodiment of the present invention. In the FIG. 7, the substrate 100b is used as a mounting device. In the FIG. 8, the mounting device includes the substrate 100b and the sub-mount 111. First, provide a substrate 100A. For example, the substrate 100A is a silicon wafer. Then, a first photo-resist pattern 31 is formed on the substrate 100A by employing a first photolithography process. An etching area 30 is created on the substrate 100A, shown in FIG. 10a. Next, a first etching process is performed on the substrate 100A in order to form the substrate 100B with a bench 108g and a convex portion 33 for combining with the concave portion 23 of the top cover 110c. Then, the first photo-resist 31 is stripped, shown in FIG. 10b. In another embodiment, instead, the concave portion 23 can be formed on the substrate 100B, and the convex portion 33 can be formed on the top cover 110c by the similar etching processes.

A second photo-resist pattern 35 is then formed on the substrate 100B by employing a second photolithography process. A second etching area 32 on the bench 108g is created on the substrate 100B, shown in FIG. 10c. Next, as shown in FIG. 10d, a second etching process is performed on the second etching area 32 on the substrate 100B in order to form the substrate 100b with a concave structure 108f under the bench 108g, and the second photo-resist pattern 35 is stripped. Subsequently, a sputtering process is performed to form an alignment mark on a bottom surface of the concave structure 108f of the substrate 100b. The glue (e.g., silver glue) is then coated on bottom surface of the concave structure 108f in corresponding with the position of the alignment mark. An optoelectronic device 106 is aligned to the substrate 100*b* via the alignment mark and then mounted or adhered on the bottom surface of the concave structure 108*f* of the substrate 100*b* by the glue. By the alignment mark, the optoelectronic device 106 is mounted on the bottom surface of the concave structure 108*f* with the first precision. The first precision is about the range within ±10 micrometers, from 0 to 10 micrometers, preferably from 3 to 5 micrometers.

In another embodiment, before the glue (e.g., silver glue) is coated on bottom surface of the concave structure 108*f* in corresponding with the position of the alignment mark, a TSV structure 124 is formed to pass from the bottom surface of the concave structure 108*f* to the bottom surface of the substrate 100*b* (from the top surface of the substrate 100*b* extending to the bottom surface of the substrate 100*b*), shown in FIG. 10*e*. Next, the optoelectronic device 106 is aligned to the substrate 100*b* via the alignment mark and then mounted or adhered on the bottom surface of the concave structure 108*f* of the substrate 100*b* by the glue with the first precision. Some electrical traces 124*a* are then formed on the top surface and the side walls of the optoelectronic device 106 and the bottom surface of the concave structure 108*f* of the substrate 100*b* to electrically connect with TSV structure 124. The traces 124*a* do not block the optical path between the optoelectronic device 106 and the light-guiding structure 107*b*. In another embodiment, we can use the wires to replace the electrical traces 124*a*, not shown in the Figures. One end of the wire is bonded on the top surface of the optoelectronic device 106, and the other end of the wire is bonded on the bottom surface of the concave structure 108*f* of the substrate 100*b* to electrically connect with TSV structure 124 formed in the substrate 100*b*.

In one embodiment, as shown in FIG. 7, after or before the top cover 110*c* with the light-guiding structure 107*b* is assembled on the substrate 100*b* with the optoelectronic device 106, the control chip 105 is mounted on the bottom surface of the concave structure 108*f* of the substrate 100*b* with the second precision. The first precision is higher than the second precision. The range of the second precision is from 20 to 50 micrometers. The control chip 105 comprises a driver integrated circuit or a trans-impedance amplifier chip, and the optoelectronic device 106 comprises a laser, a photo detector or a light emitting diode.

In one embodiment, as shown in FIG. 8, after the top cover 110*c* with the light-guiding structure 107*b* is assembled on the substrate 100*b* with the optoelectronic device 106 to form a light engine 130, the substrate 100*b* of the light engine 130 is mounted on the sub-mount 111 with the second precision to make the light engine 130 assembled with the sub-mount 111, and the control chip 105 is also mounted on the sub-mount 111 with the second precision. The distance between the control chip 105 and the substrate 100*b* in horizontal direction is the range within 200 micrometers. The sub-mount 111 is, for example, a ceramic sub-mount. The range of the second precision is from 20 to 50 micrometers.

In one embodiment, the concave portion 23 engages with the convex portion 33 so as to align the top cover 110*c* and the substrate 100*b* with the first precision. Thereby, the relative position among the light-guiding structure 107*b*, the reflective surface 110*c*1, and the optoelectronic device 106 are fixed in high precision (the first precision). The top cover 110*c* is adhered on the substrate 100*b* by glue. Thereby, the light-guiding structure 107*b* is placed between the cover 110*c* and the substrate 100*b*, and the optoelectronic device 106 faces the reflective surface 110*c*1. The first precision for aligning the top cover 110*c* and the substrate 100*b* is about the range within ±10 micrometers, from 0 to 10 micrometers, preferably from 3 to 5 micrometers. The first precision is high enough to ensure the high optical coupling efficiency between the optoelectronic device 106 and the light-guiding structure 107*b*.

Figure 11:
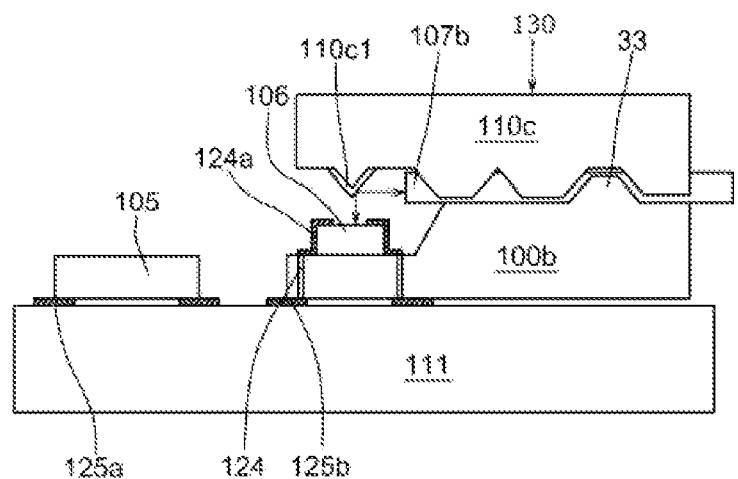
FIG. 11 illustrates an optoelectronic module according to another embodiment of the present invention.

Referring to FIG. 11, in one embodiment, the substrate 100*b* combined with the top cover 110*c*, as a light engine 130, is configured on electrical traces 125*b* of the sub-mount 111. The sub-mount 111 is, for example, a PCB. The electrical traces 125*b* are formed on the top surface of the sub-mount 111. The TSV structure 124 is electrically connected to the electrical traces 125*b* by soldering. Thus, the optoelectronic device 106 is electrically connected to the sub-mount 111 via the traces 124*a*, TSV structure 124 and the traces 125*b*, instead of the wire-bonding. The control chip 105 is also configured on traces 125*a* of the sub-mount 111. The traces 125*a* are formed on the top surface of the sub-mount 111. Thus, the control chip 105 is electrically connected to the sub-mount 111 via the traces 125*a*. The wire-bonding is no need.

To address the shortcoming for the prior art having a low yield rate, the present invention utilizes at least two alignment steps with respective precisions which are different to each other for improving the manufacturing yield rate of the optoelectronic module. By the efforts and research of the inventors, it is necessary to high-precisely position optical elements (e.g. optoelectronic device, reflective surface, light-guiding structure, etc.) to enhance optical coupling efficiency of the optoelectronic module, and for control components (e.g. control chip) and even light engine, it should not be a high-precision requirement for positioning. Therefore, for the manufacturing process of the optoelectronic module in the embodiments of the invention, the optoelectronic device is mounted on the mounting device with high precision by the alignment mark, and the reflective surface and light-guiding structure are positioned with high precision by the concave portion and convex portion. The invention has the advantages of easy manufacture and a high yield rate and can achieve the requirement of high optical coupling efficiency. The invention also takes the lower precision for positioning the control chip and/or light engine to achieve the requirement to improve the manufacturing yield rate.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A method for manufacturing an optoelectronic module, comprising:

providing a top cover with a reflective surface;
forming a light-guiding structure;
providing a mounting device;
forming an optoelectronic device on said mounting device with a first precision;
forming a control chip on said mounting device with a second precision different from said first precision;
combining said top cover and said mounting device, wherein said light-guiding structure is between said top cover and said mounting device, and said optoelectronic device faces said reflective surface, wherein said mounting device has a concave structure, said mounting device comprises a substrate and a sub-mount, said concave structure is formed on said substrate, said control chip is mounted on said sub-mount with said second precision, and said optoelectronic device is mounted on a bottom surface of said concave structure of said substrate with said first precision;

forming a through hole structure passing from said bottom surface of said concave structure to a bottom surface of said substrate; and bonding one end of at least one electrical trace on a top surface of said optoelectronic device and the other end of said electrical trace on said bottom surface of said concave structure to electrically connect with said through hole structure.

2. The method of claim 1, wherein an included angle between said reflective surface and a top surface of said top cover is 45 degree.

3. The method of claim 1, wherein material of said top cover comprises silicon.

4. The method of claim 1, wherein said light-guiding structure is formed on said top cover.

5. The method of claim 4, wherein said top cover comprises a V-groove structure formed by photolithography and etching processes.

6. The method of claim 5, wherein forming said light-guiding structure comprises fixing fibers in said V-groove structure by glue.

7. The method of claim 6, wherein said glue contacts with said reflective surface.

8. The method of claim 1, wherein the concave structure of the mounting device is formed by photolithography and etching processes.

9. The method of claim 1, wherein said forming said optoelectronic device on said mounting device with said first precision comprises:

forming an alignment mark on a bottom surface of said concave structure of said mounting device;

aligning said optoelectronic device to said mounting device via said alignment mark; and mounting said optoelectronic device on said bottom surface of said concave structure.

10. The method of claim 1, wherein said optoelectronic device is mounted on a bottom surface of said concave structure with said first precision, and said control chip is mounted on said bottom surface of said concave structure with said second precision.

11. The method of claim 1, further comprises:

forming a through hole structure passing from said bottom surface of said concave structure to a bottom surface of said substrate; and forming electrical traces on a top surface and side walls of said optoelectronic device and said bottom surface of said concave structure to electrically connect with said through hole structure.

12. The method of claim 1, wherein said substrate is mounted on said sub-mount with said second precision.

13. The method of claim 12, wherein the distance between said control chip and said substrate is a range within 200 micrometers.

14. The method of claim 1, wherein material of said mounting device comprises silicon.

15. The method of claim 1, wherein said top cover comprises one of a concave portion and a convex portion formed by etching said top cover, said mounting device comprises the other of said concave portion and said convex portion formed by etching said mounting device, and said concave portion and said convex portion are used to align said top cover and said mounting device with said first precision.

16. The method of claim 1, wherein said first precision is higher than said second precision.

17. The method of claim 16, wherein a range of said first precision is from 0 to 10 micrometers.

18. The method of claim 17, wherein said range of said first precision is from 3 to 5 micrometers.

19. The method of claim 17, wherein a range of said second precision is from 20 to 50 micrometers.

* * * * *